(12) United States Patent
Liou (10) Patent No.: US 8,129,805 B2
(45) Date of Patent: Mar. 6, 2012

(54) MICROELECTROMECHANICAL SYSTEM (MEMS) DEVICE AND METHODS FOR FABRICATING THE SAME

(75) Inventor: Tsyr-Shyang Liou, Taipei (TW)

(73) Assignee: Richwave Technology Corp., Taipei (TW)

( * ) Notice: Subject to any disclaimer, the term of this patent is extended or adjusted under 35 U.S.C. 154(b) by 198 days.

(21) Appl. No.: 12/759,845

(22) Filed: Apr. 14, 2010

(65) Prior Publication Data
US 2011/0175177 A1 Jul. 21, 2011

(30) Foreign Application Priority Data
Jan. 21, 2010 (TW) .............................. 99101593 A (51) Int. Cl.
*H01L 29/84* (2006.01)
*H01L 21/02* (2006.01)
(52) U.S. Cl. .................. 257/419; 257/E29.324; 438/52; 438/53
(58) Field of Classification Search .................. 257/415, 257/417, 419, E27.167, E29.324; 438/52, 438/53
See application file for complete search history.

(56) References Cited

U.S. PATENT DOCUMENTS

| | | | | |
|---|---|---|---|---|
| 5,316,979 A | * | 5/1994 | MacDonald et al. | 438/52 |
| 6,712,983 B2 | * | 3/2004 | Zhao et al. | 216/2 |
| 7,951,636 B2 | * | 5/2011 | Lee et al. | 438/53 |
| 2010/0044147 A1 | * | 2/2010 | Wang | 181/164 |

* cited by examiner

*Primary Examiner* — Minh-Loan T Tran
(74) *Attorney, Agent, or Firm* — Thomas|Kayden (57) ABSTRACT

A method of fabricating a microelectromechanical system (MEMS) device includes providing a semiconductor substrate having a semiconductor layer and an interconnect structure. A passivation layer and a photoresist layer are formed over the interconnect structure and a plurality of openings are formed in the photoresist layer to expose portions of the passivation layer. The passivation layer exposed by the openings and the interconnect structure thereunder are removed, forming a plurality of first trenches. The semiconductor layer exposed by the first trenches is removed, forming a plurality of second trenches in the semiconductor layer. An upper capping substrate is provided over the passivation layer, forming a first composite substrate. The semiconductor layer in the first composite substrate is thinned and portions of the thinned semiconductor layer are etched to form a third trench, wherein a suspended micromachined structure is formed in a region between the first, second and third trenches.

18 Claims, 7 Drawing Sheets

MICROELECTROMECHANICAL SYSTEM (MEMS) DEVICE AND METHODS FOR FABRICATING THE SAME

CROSS REFERENCE TO RELATED APPLICATIONS

This Application claims priority of Taiwan Patent Application No. 99101593, filed on Jan. 21, 2010, the entirety of which is incorporated by reference herein.

BACKGROUND OF THE INVENTION

1. Field of the Invention

The present invention relates to fabrication of a microelectromechanical system (MEMS) device, and in particularly to a method for fabricating a MEMS device capable of preventing dielectric or metal layers of micromachined structures therein from damages.

2. Description of the Related Art

Microelectromechanical structures (MEMS) have found applications in inertial measurement, pressure sensing, thermal measurement, micro-fluidics, optics, and radio frequency communications, and the application field for these structures continues to grow. Conventional microelectromechanical structures, such as accelerometers, pressure sensors, flow sensors, microactuators and the like, typically comprise suspended micromachined structures having a released portion spaced apart from a substrate and one or more posts attached the substrate.

Generally, during fabrication of the micromachined structures, an uppermost patterned metal layer is used as an etching mask and an adequate etching process is performed to remove films not covered by the patterned metal layer to thereby form the micromachined structure.

Nevertheless, in the above etching process, since the patterned metal layers show limited etch resistance during the etching process, the obtained micromachined structure may not be formed in a desired profile. Thus, portions of the film layers in the micromachined structure may be partially or entirely removed during the etching process, thereby negatively affecting functionality of the obtained MEMS device.

BRIEF SUMMARY OF THE INVENTION

Accordingly, a microelectromechanical system (MEMS) device and a method of fabricating the same for ensuring completeness of films in a micromachined structure in the MEMS device are provided to ensure functionality of the MEMS device.

An exemplary method of fabricating a microelectromechanical system (MEMS) device comprises providing a semiconductor substrate comprising a semiconductor layer and an interconnect structure formed over the semiconductor layer. A passivation layer and a photoresist layer are sequentially formed over the interconnect structure. A plurality of openings is formed in the photoresist layer, wherein the openings expose a portion of the passivation layer. A first etching process is performed using the photoresist layer as an etching mask to remove the passivation layer exposed by the openings and the interconnect structure thereunder, and forms a plurality of first trenches exposing a portion of the semiconductor layer. The photoresist layer is removed to expose the passivation layer. A second etching process is performed using the passivation layer as an etching mask to remove a portion of the semiconductor layer exposed by the first trenches, and forms a plurality of second trenches in the semiconductor layer. An upper capping substrate is attached to the passivation layer to form a first composite substrate. A surface of the semiconductor layer of the first composite substrate in areas where the second trench is not formed, leaving a thinned semiconductor layer. A third etching process is performed to partially remove the thinned semiconductor layer and to form a third trench therein, wherein the third trench exposes and connects the second trenches, and a suspended micromachined structure is defined in a region between the first trench, the second trenches, and the third trench.

An exemplary microelectromechanical system device comprises a semiconductor substrate comprising: a semiconductor layer and an interconnect structure formed over the semiconductor layer, wherein the semiconductor layer has opposing first and second sides, and the interconnect structure is formed over a surface of the semiconductor layer from the first side; a passivation layer disposed over the interconnect structure; a plurality of first trenches disposed in a portion of the passivation layer, the interconnect structure, and the semiconductor substrate; an upper capping substrate disposed over the passivation layer; a second trench disposed in a portion of the semiconductor layer from the second side, wherein the second trench exposes and connects with the first trenches, and the first trenches and the second trench defines a suspended micromachined structure therebetween; and a lower capping film attached to a surface of the semiconductor layer from the second side, wherein the upper capping substrate, the semiconductor substrate, and the lower capping substrate form a sealed chamber therebetween.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1a-1g are cross sections showing an exemplary method for fabricating a microelectromechanical system (MEMS) device capable of ensuing a profile of film layers in micromachined structures therein and functionality of the MEMS device comprising the fabricated micromachined structures.

Figure 1A:
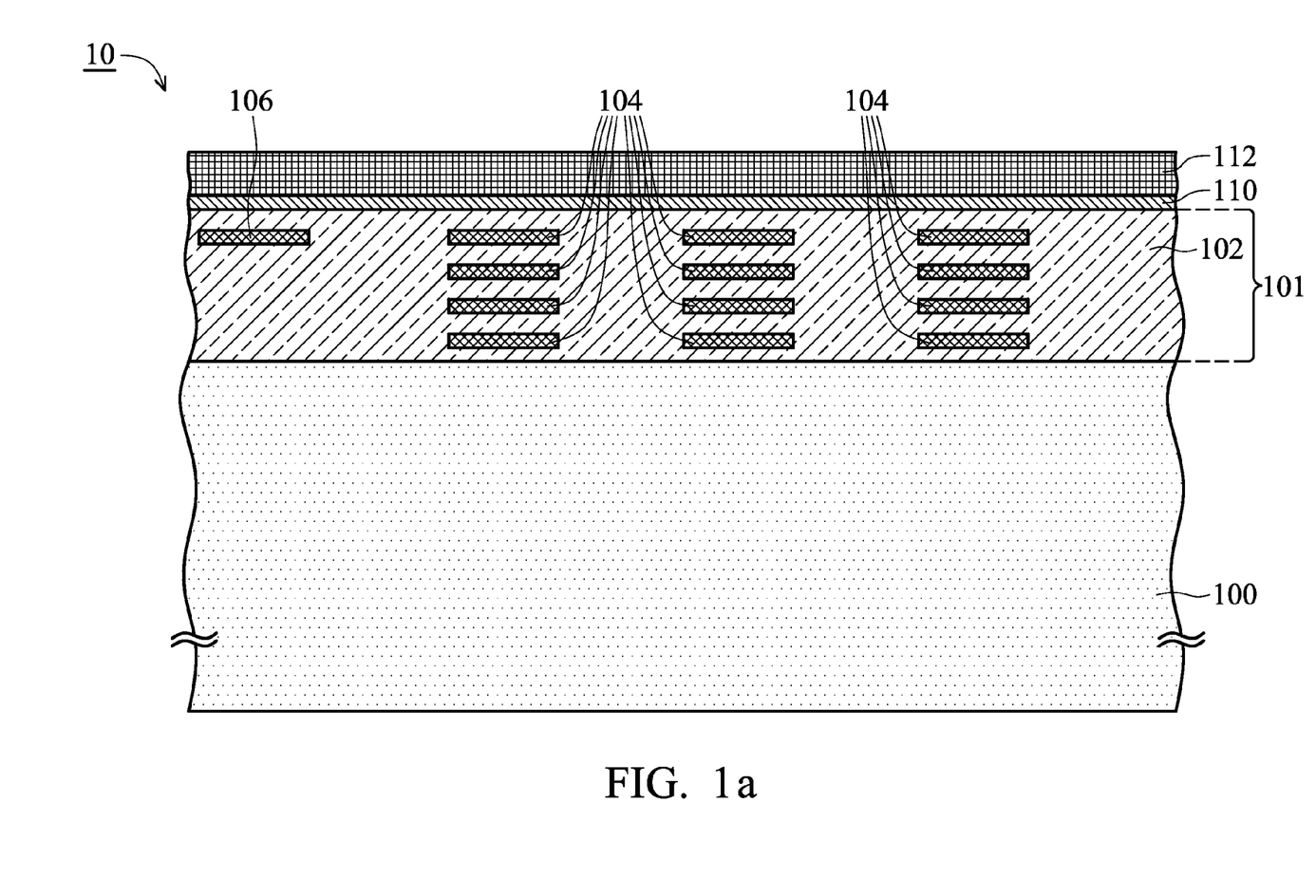
FIGS. 1a-1g are cross sections showing a method of fabricating a microelectromechanical device according to an embodiment of the invention.

In FIG. 1a, a semiconductor substrate 10 is first provided. As shown in FIG. 1a, the semiconductor substrate 10 is an uncut semiconductor wafer having a plurality of substantially fabricated, but not separated, integrated circuit (IC) regions (not shown) thereover. For simplicity, only fabrication of a micromachined structure of a microelectromechanical system (MEMS) device in one of the IC regions is partially illustrated in FIG. 1a. As shown in FIG. 1a, the IC region provided over the semiconductor substrate 10 comprises a semiconductor layer 100 and an interconnect structure 101 formed over the semiconductor layer 100. Herein, the interconnect structure 101 comprises a dielectric layer 102, a plurality of conductive layers 104 disposed in various regions in the dielectric layer 102, and a bond pad 106 disposed in the dielectric layer 102. The conductive layers 104 are stacked over a same region from bottom to top. The semiconductor layer 100 can be, for example, a bulk silicon layer, and passive elements, active elements and other elements and/or combinations thereof can be formed at adequate places in or above the semiconductor layer 100. In one embodiment, the passive elements can be, for example, resistors, capacitors, inductances and/or fuses, and the active elements can be, for example, p-channel field effect transistors (PFET), n-channel field effect transistors (NFET), metal-oxide-semiconductor field effect transistors (MOSFET), complementary metal oxide transistors (CMOS), high voltage transistors, and/or high frequency transistors. The dielectric layer 102 may comprise dielectric materials such as silicon oxide or silicon nitride and may have a thickness of about 8-9 μm.

For the purpose of simplicity, the elements formed in the IC region shown in FIG. 1a are not illustrated, and only a planar semiconductor layer 100 is illustrated. Although the interconnect structure 101 is illustrated by a structure comprising the conductive layers 104 and the bond pad 106 disposed in the dielectric layer 102, the invention is not limited thereto. Other elements such as a plurality of interconnecting elements made of conductive elements comprising conductive layers and conductive vias can be further disposed in the dielectric layer 102 to electrically connect the conductive layers 104 and the bond pad 106 with the elements disposed in or above the semiconductor layer 100. The above described layers and elements formed in or above the semiconductor layer 100 and the interconnect structure 101 can be fabricated by a standard complementary metal-oxide-semiconductor (CMOS) process, and fabrication thereof is not discussed here in detail, for simplicity.

Next, a passivation layer 110 and a photoresist layer 112 are blanketly formed over the dielectric layer 102. Herein, the passivation layer 110 may comprise dielectric materials such as silicon oxide and has a thickness of about 0.8-1.0 μm. The passivation layer 110 and the dielectric layer 10 preferably comprise the same materials such that they may have a similar etching selectivity to an etchant. In addition, the photoresist layer 112 may comprise photoresist materials typically used in fabrication of MEMS devices and may have a thickness of about 5~15 μm.

Figure 1B:
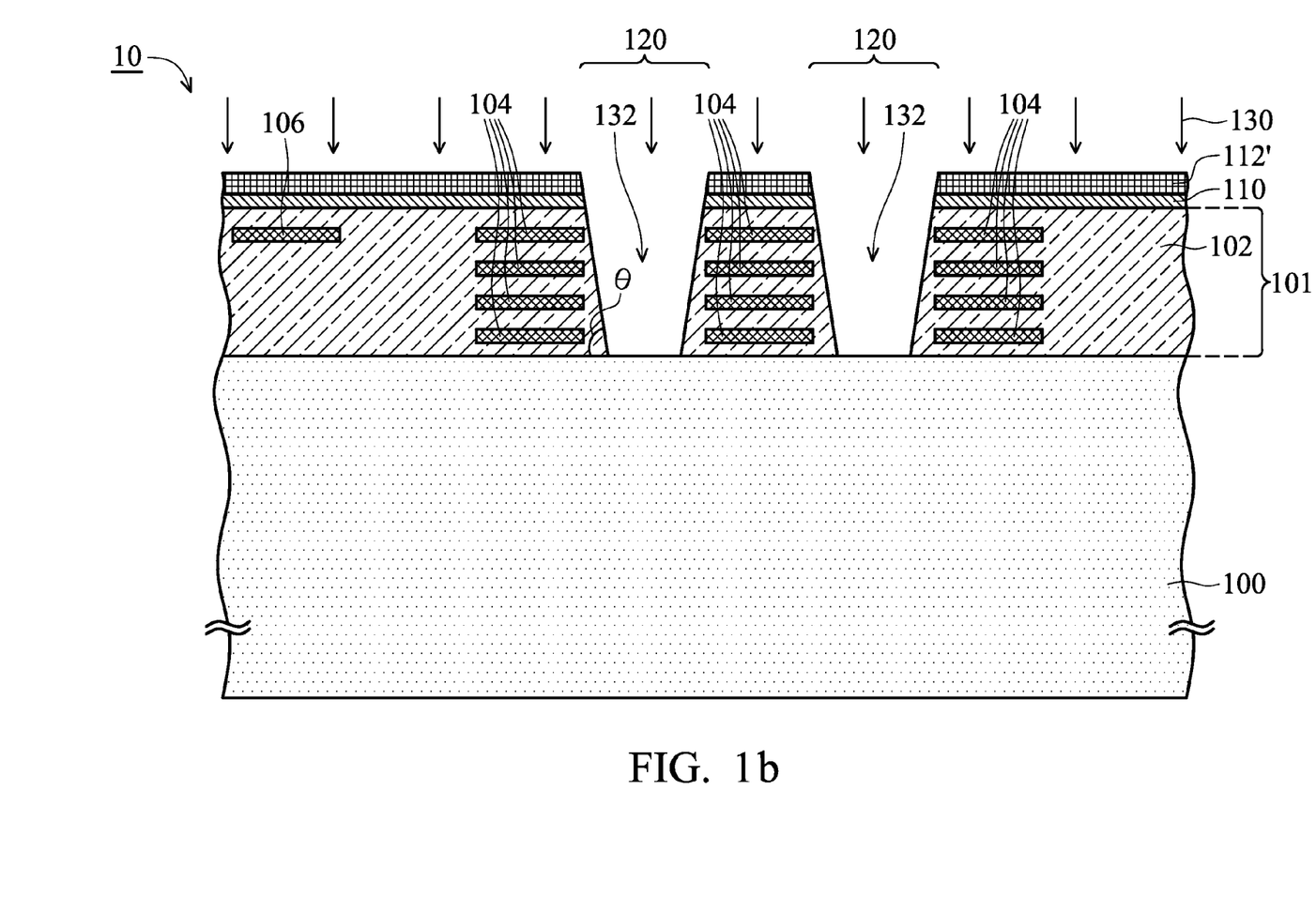

In FIG. 1b, a photolithography process (not shown) is performed to form a plurality of openings 120 in the photoresist layer 112. The openings 120, are respectively located over a portion of the dielectric layer 102 between the conductive layers 104 and partially expose a surface of a portion of the passivation layer 110. Next, an etching process 130 is performed to remove the passivation layer 110 and a portion of the dielectric layer 102 under the passivation layer 110 exposed by the openings 120, thereby forming a plurality of trenches 132 in the dielectric layer 102. In one embodiment, the etching process 130 can be an anisotropic etching process such as a reactive ion etching (RIE) process. Herein, the etchants used in the etching process 130 not only removes the dielectric layer 102 but also partially removes a portion of the photoresist layer 112, thereby leaving a thinned photoresist layer 112' over the passivation layer 110. The trenches 132 in the dielectric layer 102 expose a portion of the semiconductor layer 100, and an included angle θ greater than 85° is provided between the dielectric layer 132 adjacent to the trench 132 and the semiconductor layer 100 to thereby ensure that each of the trenches 132 has a profile substantially perpendicular to the semiconductor layer 100.

Figure 1C:
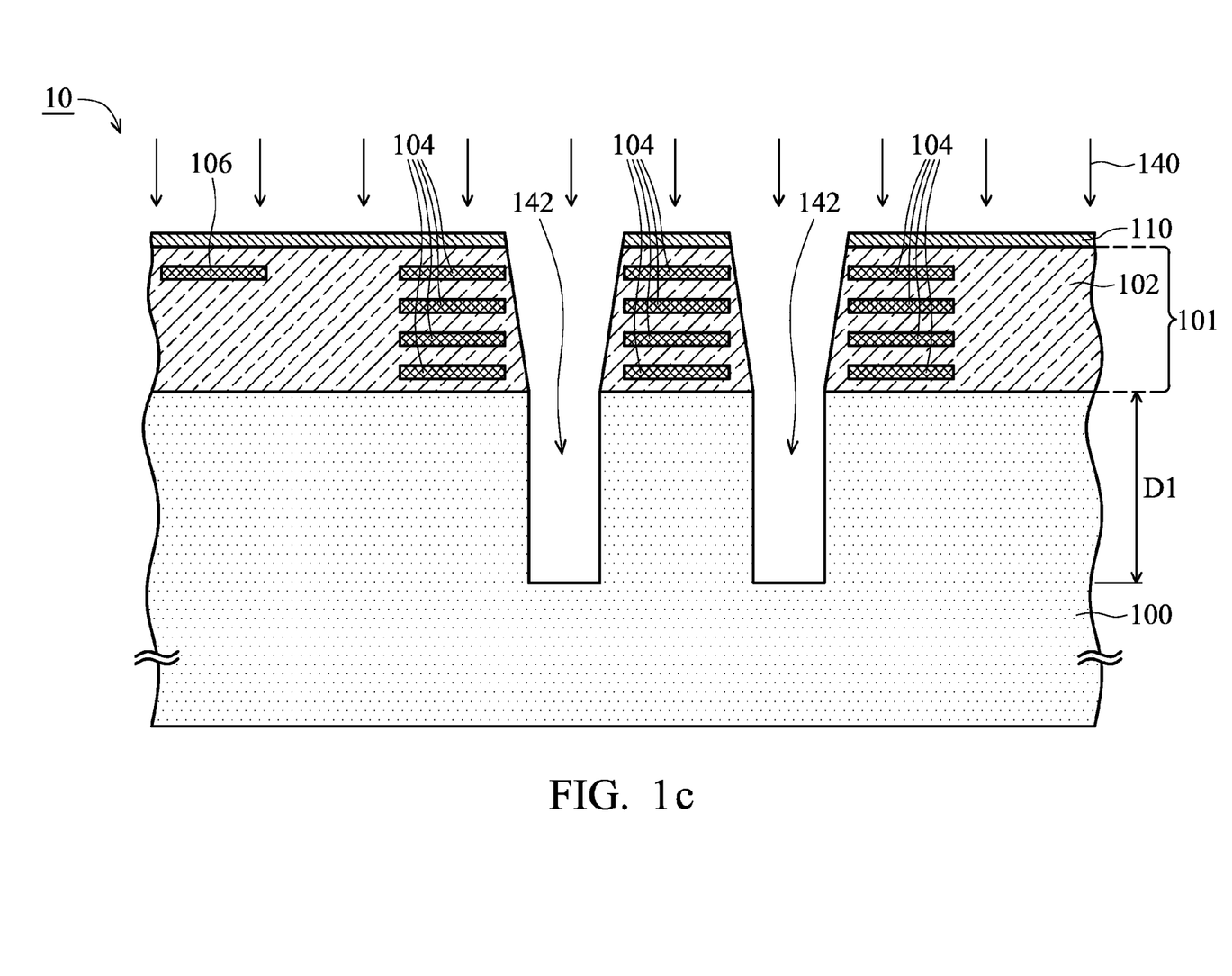

In FIG. 1c, an etching process (not shown) is performed to remove the thinned photoresist layer 112' over the passivation layer 110, and an etching process 140 is then performed to remove a portion of the semiconductor layer 100 exposed by the trenches 132 (see FIG. 1b), thereby forming a plurality of trenches 142 in the semiconductor layer 100. In the etching process 140, the passivation layer 110 serves as an etch stop to prevent the dielectric layer 102 covered by the passivation layer 110 from being etched in the etching process 140. The trenches 142 formed in the dielectric layer 102 have a depth D1 of about 20-50 μm from a top surface of the semiconductor layer 100. In one embodiment, the etching process 140 can be as an anisotropic etching process such as a deep reactive ion etching (DRIE) process.

Figure 1D:
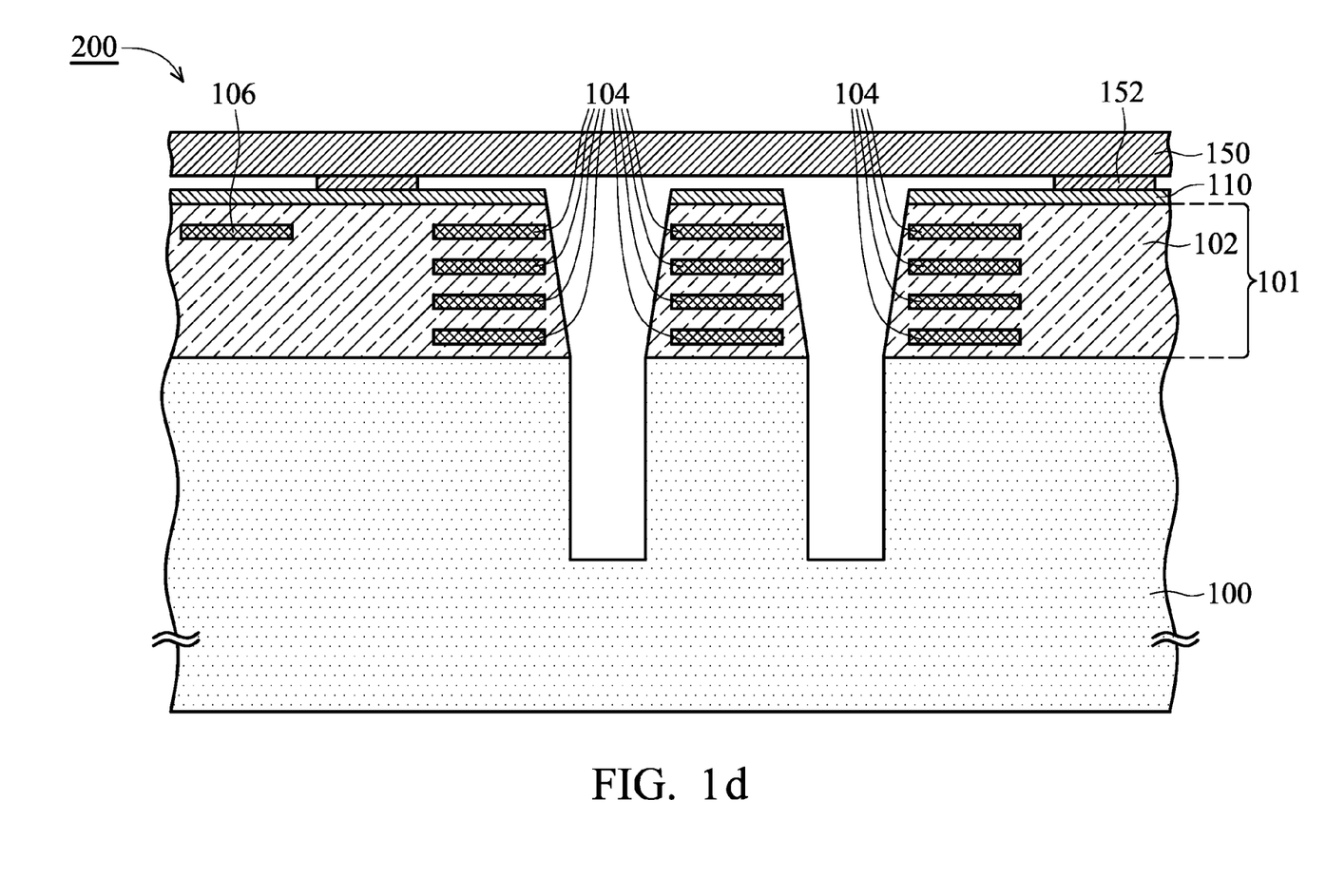

In FIG. 1d, an adhesive layer 152 is formed over portions over the passivation layer 110. The adhesive layer 152 may comprise adhesive materials such as frit. An upper capping substrate 150 is then provided over the semiconductor substrate 10 and then attached to the semiconductor substrate 10 by use of the adhering layers 152, thereby forming a composite substrate 200, as shown in FIG. 1d. Herein, the upper capping substrate 150 may comprise a silicon or glass wafer.

Figure 1E:
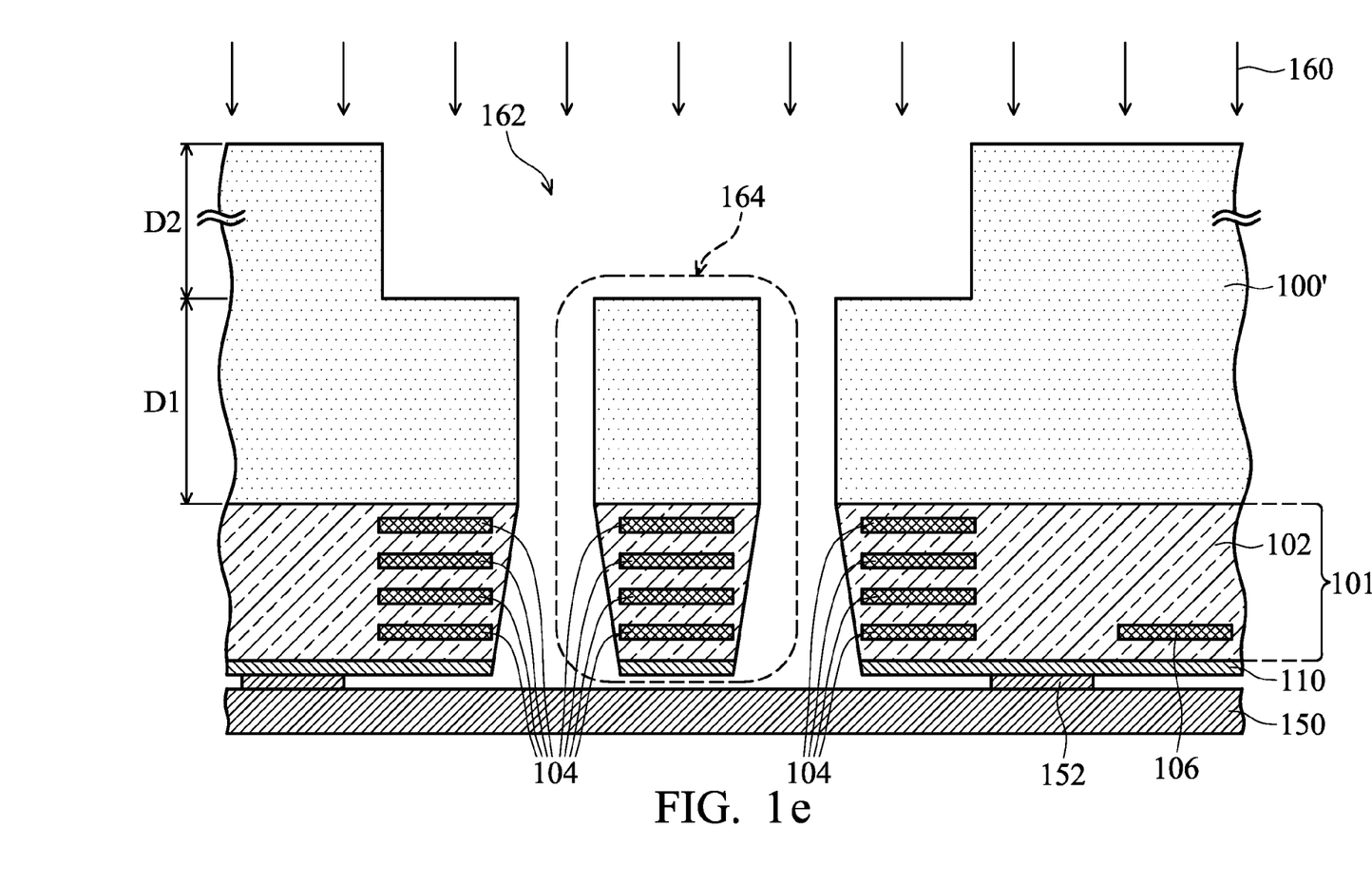

In FIG. 1e, the composite substrate 200 shown in FIG. 1d is inverted. A thinning process (not shown), such as a chemical mechanical polishing (CMP) process, is then performed to the surface of the semiconductor layer 100 in areas no trench is formed by holding the upper capping substrate 150, thereby forming a thinned semiconductor layer 100'. Next, an etching process 160 is performed to form a wide trench 162 in the thinned semiconductor layer 100'. In one embodiment, the etching process 160 can be an anisotropic etching process such as a deep reactive ion etching (DRIE) process. As shown in FIG. 1e, the wide trench 162 substantially exposes and connects the trenches 142 formed in the thinned semiconductor layer 100'. Thus, after formation of the wide trench 162, a suspended micromachined structure is defined and formed in a region 164. Herein, the micromachined structure in the region 164 comprises the thinned semiconductor layer 100', the dielectric layer 102 and the conductive layers 104 formed in the dielectric layer 102. The conductive layers 104 in the dielectric layer 102 are arranged in parallel and separated by the dielectric layer 102, such that the suspended micromachined structure in the region 164 may function as a sensing capacitor. Functionality and structure of the suspended micromachined structure in the region 164 is not limited by that shown in FIG. 1e. To the contrary, the suspended micromachined structure in the region 164 may have other structures and functionalities rather than that shown in FIG. 1e.

Figure 1F:
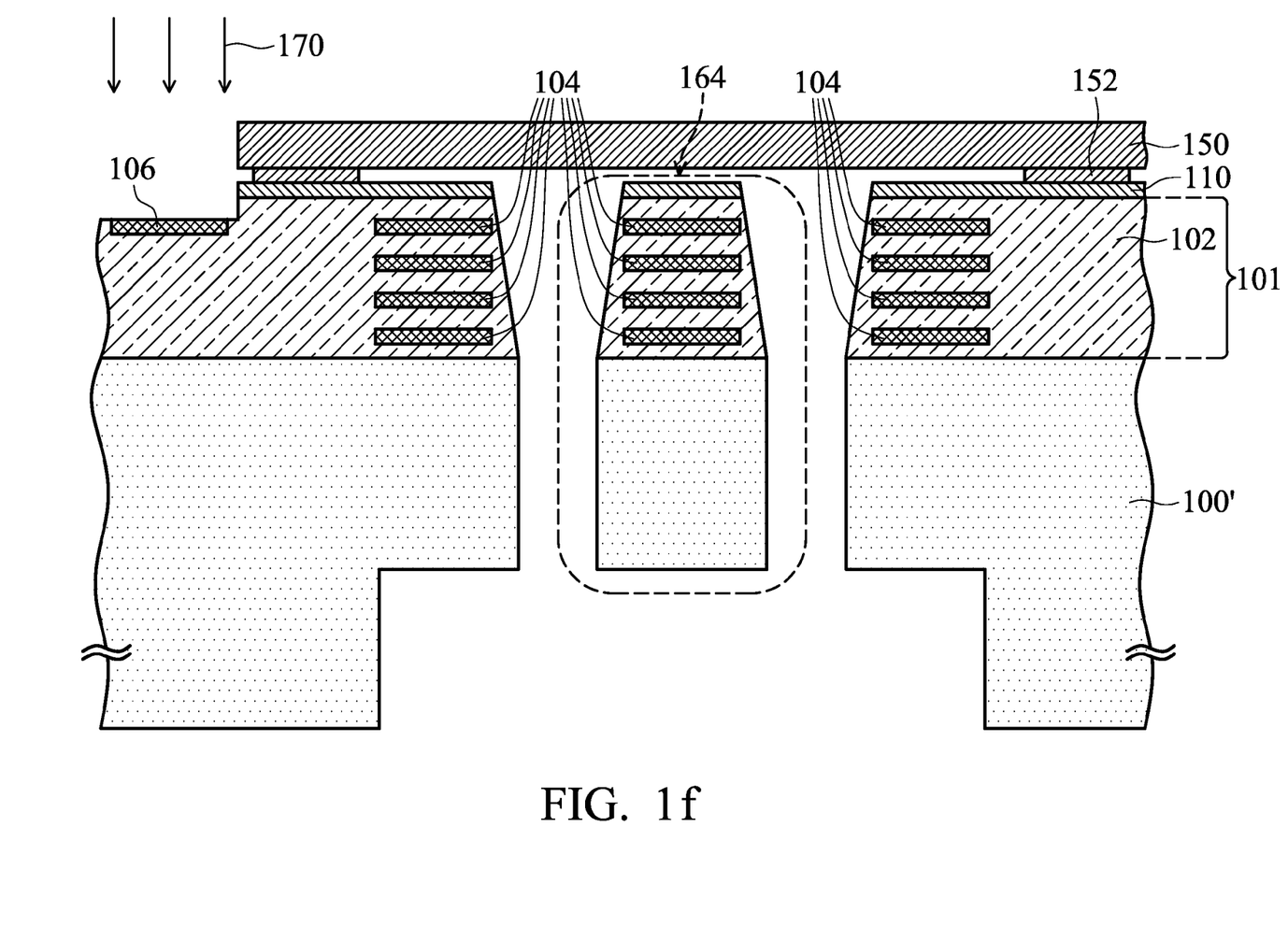

As shown in FIG. 1f, the structure shown in FIG. 1e is inverted and a cutting process 170 is performed to expose the bond pad 106 formed in the dielectric layer 102. Herein, the cutting process 170 can be, for example, a laser cutting or a mechanical cutting process, and a portion of the upper capping substrate 150, the passivation layer 110 and the dielectric layer 102 above the bond pad 106 are removed in the cutting process 170 until a surface of the bond pad 106 is exposed.

Figure 1G:
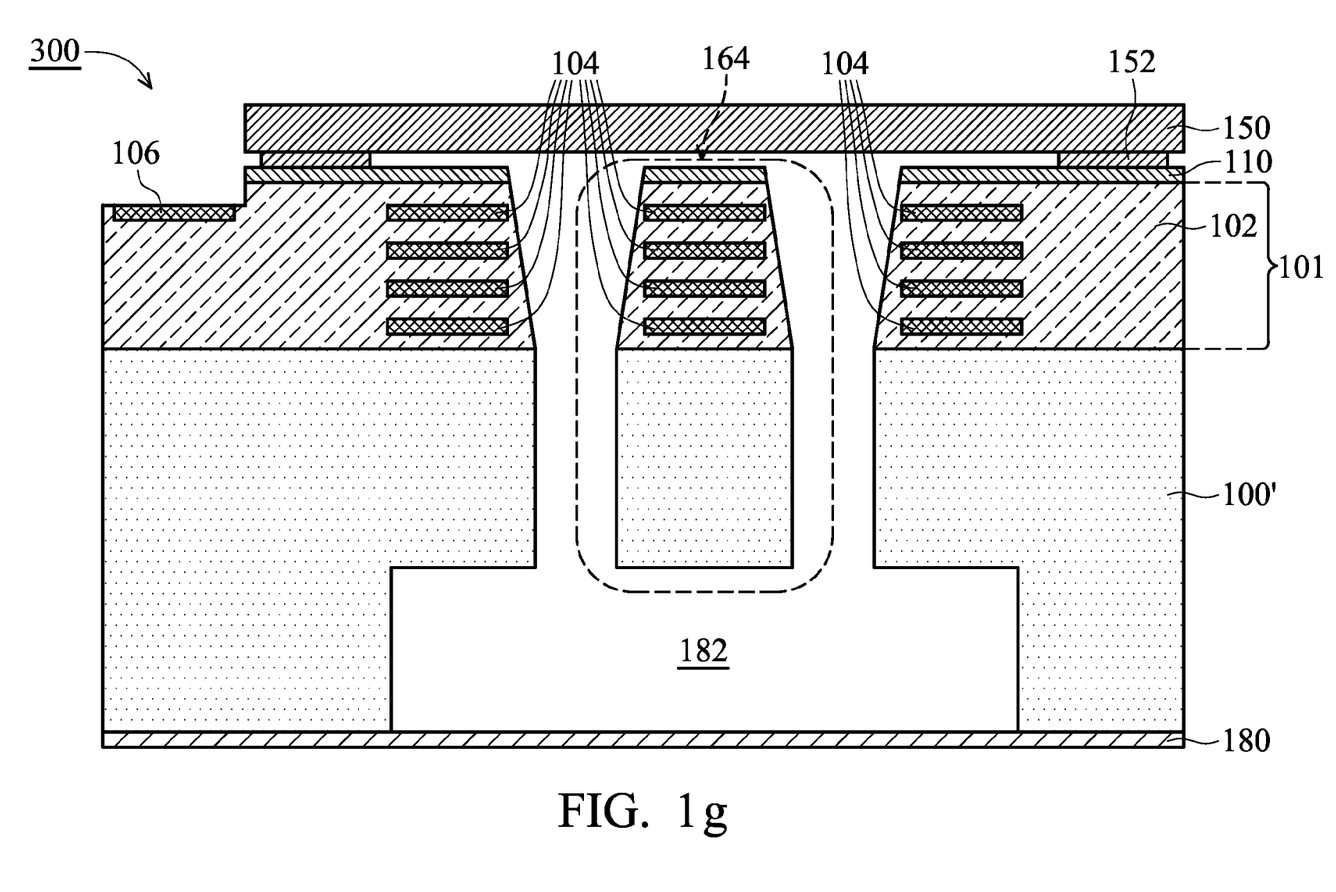

In FIG. 1g, a lower capping film 180 is provided and attached to the surface of the thinned semiconductor layer 100' where the wide trench 162 is formed. The lower capping film 170 can be, for example, a die attached film (DAF). The lower capping film 180 can be a dry film made of insulating materials such as a hot melt adhesive. Another composite substrate (not shown) is formed after attachment of the lower capping film 180 to the composite substrate 200. After formation of the lower capping substrate 180, a cutting process (not shown) such as a wafer cutting process is performed to the composite substrate to separate the composite structure made of the upper capping substrate 150, the semiconductor substrate 10, and the lower capping film 180 into a plurality of independent microelectromechanical system (MEMS) device 300. As shown in FIG. 1g, after formation of the MEMS device 300, a sealed chamber 182 is provided among the thinned semiconductor layer 110', the upper capping substrate 150, and the lower capping substrate 180. The sealed chamber 182 is formed with an inner pressure of about 1 atm and thus provides a space for allowing suitable movement of the suspended micromachined structure provided in the region 164 and ensures sensitivity of the micromachined structure. The MEMS device 300 shown in FIG. 1g can be then disposed over a package substrate (not shown) depending on process demands, and a bonding process such as a wire boding process can be performed to form a conductive wire bonding which connects the package substrate (not shown) with the bond pad 106 in the MEMS device 300, thereby forming electrical connection between the MEMS device 300 and the package substrate.

As shown in FIG. 1g, an exemplary MEMS device is illustrated, comprising a semiconductor substrate comprising a semiconductor layer (e.g. the thinned semiconductor layer 100') and an interconnect structure (e.g. the interconnect structure) formed over the semiconductor layer, wherein the semiconductor layer has opposing first and second sides, and the interconnect structure is formed over a surface of the semiconductor layer at the first side. A passivation layer (e.g. the passivation layer 110) is disposed over the interconnect structure. A plurality of first trenches (e.g. combination of the trenches 132 and 142) are respectively disposed in a portion of the passivation layer, the interconnect structure, and the semiconductor substrate. An upper capping substrate (e.g. the upper capping substrate 150) is disposed over the passivation layer. A second trench (e.g. the wide trench 162 shown in FIG. 1e) is disposed in a portion of the semiconductor layer at the second side, wherein the second trench exposes and connects with the first trenches, and the first trenches and the second trench defines a suspended micromachined structure (e.g. the suspended micromachined structure in the region 164) therebetween. A lower capping film (e.g. the lower capping film 180) is attached to a surface of the semiconductor layer from the second side, wherein the upper capping substrate, the semiconductor substrate, and the lower capping substrate form a sealed chamber (e.g. the sealed chamber 182) therebetween.

Based on the exemplary fabrication method illustrated in FIGS. 1a-1g and the exemplary MEMS device shown in FIG. 1g, an improved fabrication method is provided by the invention by using an additional passivation layer and a photoresist layer as etching masks for ensuring a profile of films of a micromachined structure in a MEMS device. Reliability of a MEMS device comprising such a micromachined structure fabricated by the improved method can thus be ensured.

In addition, since fabrication of the exemplary MEMS device can be achieved by wafer level fabrication and packaging processes, the micromachined structure and the integrated circuit elements used in the MEMS device can be simultaneously fabricated and no additional packaging process is needed. Therefore, a majority of the fabricating processes of the MEMS device can be completed in an IC foundry and transported to a packaging company for wafer cutting, such that fabrication costs of an MEMS device can thus be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a microelectromechanical system (MEMS) device, comprising:
    providing a semiconductor substrate comprising a semiconductor layer and an interconnect structure formed over the semiconductor layer;
    sequentially forming a passivation layer and a photoresist layer over the interconnect structure;
    forming a plurality of openings in the photoresist layer, wherein the openings expose a portion of the passivation layer;
    performing a first etching process, using the photoresist layer as an etching mask, to remove the passivation layer exposed by the openings and the interconnect structure thereunder, forming a plurality of first trenches exposing a portion of the semiconductor layer;
    removing the photoresist layer to expose the passivation layer;
    performing a second etching process, using the passivation layer as an etching mask, removing a portion of the semiconductor layer exposed by the first trenches, and forming a plurality of second trenches in the semiconductor layer;
    attaching an upper capping substrate to the passivation layer to form a first composite substrate;
    thinning a surface of the semiconductor layer of the first composite substrate in areas where the second trench is not formed, leaving a thinned semiconductor layer; and
    performing a third etching process to partially remove the thinned semiconductor layer and form a third trench therein, wherein the third trench exposes and connects the second trenches, such that a suspended micromachined structure is defined in a region between the first trench, the second trenches, and the third trench.

2. The method as claimed in claim 1, further comprising:
    performing a first cutting process to partially remove a portion of the upper capping substrate, the passivation layer, and the dielectric layer, exposing a bond pad in the interconnect structure;
    attaching a lower capping film to a surface of the thinned semiconductor layer with the third trench therein, forming a second composite substrate; and
    performing a second cutting process to cut the second composite substrate and form a microelectromechanical device comprising the suspended micromachined structure and the bond pad.

3. The method as claimed in claim 2, wherein the second cutting process is a wafer cutting process.

4. The method as claimed in claim 2, wherein the upper capping substrate, the semiconductor substrate, and the lower capping film form a sealed chamber therebetween.

5. The method as claimed in claim 1, wherein the interconnect structure comprises a dielectric layer and a plurality of conductive layers, wherein the passivation layer and the dielectric layer have a similar etching selectivity to an etchant.

6. The method as claimed in claim 5, wherein the suspended micromachined structure comprises a sensing capacitor composed of the dielectric layer and the conductive layers.

7. The method as claimed in claim 1, wherein the first etching process is a reactive ion etching process.

8. The method as claimed in claim 1, wherein the second etching process is a reactive ion etching process.

9. The method as claimed in claim 1, wherein the third etching process is a deep reactive ion etching process.

10. The method as claimed in claim 1, wherein the upper capping substrate comprises silicon or glass.

11. The method as claimed in claim 1, wherein the lower capping film is a die attached film.

12. The method as claimed in claim 1, wherein the first cutting process is a laser cutting process or a mechanical cutting process.

13. A microelectromechanical system (MEMS) device, comprising:
- a semiconductor substrate comprising a semiconductor layer and an interconnect structure formed over the semiconductor layer, wherein the semiconductor layer has opposing first and second sides, and the interconnect structure is formed over a surface of the semiconductor layer at the first side;
- a passivation layer disposed over the interconnect structure;
- a plurality of first trenches disposed in a portion of the passivation layer, the interconnect structure, and the semiconductor substrate;
- an upper capping substrate disposed over the passivation layer;
- a second trench disposed in a portion of the semiconductor layer at the second side, wherein the second trench exposes and connects with the first trenches, and the first trenches and the second trench defines a suspended micromachined structure therebetween; and
- a lower capping film attached to a surface of the semiconductor layer at the second side, wherein the upper capping substrate, the semiconductor substrate, and the lower capping substrate form a sealed chamber therebetween.

14. The MEMS device as claimed in claim 13, wherein the interconnect structure further comprises a bond pad, and the upper capping substrate and the passivation layer partially cover the interconnect structure but not cover the bond pad.

15. The MEMS device as claimed in claim 13, wherein the upper capping substrate comprises glass or silicon.

16. The MEMS device as claimed in claim 13, wherein the lower capping film is a die attached film.

17. The MEMS device as claimed in claim 16, wherein the die attached film is a dry film.

18. The MEMS device as claimed in claim 13, wherein the interconnect structure comprises a dielectric layer and a plurality of conductive layers formed in the dielectric layer, and the dielectric layer and the conductive layers formed therein function as a sensing capacitor.

* * * * *